United States Patent
Jung et al.

[11] Patent Number: 6,067,255
[45] Date of Patent: May 23, 2000

[54] MERGED MEMORY AND LOGIC (MML) INTEGRATED CIRCUITS INCLUDING INDEPENDENT MEMORY BANK SIGNALS AND METHODS

[75] Inventors: Seong-ook Jung; Min-hwa Jang, both of Seoul, Rep. of Korea

[73] Assignee: Samsung Electronics Co., Ltd., Rep. of Korea

[21] Appl. No.: 09/059,117

[22] Filed: Apr. 13, 1998

[30] Foreign Application Priority Data

Jul. 3, 1997 [KR] Rep. of Korea ............... 97-30890
Jul. 7, 1997 [KR] Rep. of Korea ............... 97-31390

[51] Int. Cl.$^7$ .................................................. G11C 7/00
[52] U.S. Cl. .......................... 365/189.02; 365/185.11; 365/201; 365/230.03
[58] Field of Search ................. 365/189.02, 189.05, 365/185.11, 201, 230.03; 326/39

[56] References Cited

U.S. PATENT DOCUMENTS

| | | | |
|---|---|---|---|
| 3,761,898 | 9/1973 | Pao | 365/190 |
| 4,542,454 | 9/1985 | Brcich et al. | 711/106 |
| 4,656,614 | 4/1987 | Suzuki | 365/230 |
| 4,797,850 | 1/1989 | Amitai | 711/106 |
| 4,870,619 | 9/1989 | Van Ness | 365/208 |
| 5,315,553 | 5/1994 | Morris | 365/201 |
| 5,400,281 | 3/1995 | Morigami | 365/201 |
| 5,428,770 | 6/1995 | Garner | 714/733 |
| 5,590,071 | 12/1996 | Kolor et al. | 365/149 |
| 5,598,374 | 1/1997 | Rao | 365/230.03 |
| 5,613,094 | 3/1997 | Khan et al. | 395/500 |
| 5,724,603 | 3/1998 | Nishiguchi | 712/33 |
| 5,771,199 | 6/1998 | Lee | 365/230.03 |
| 5,848,016 | 12/1998 | Kwak | 365/201 |
| 5,867,180 | 2/1999 | Katayama et al. | 345/512 |
| 5,889,714 | 3/1999 | Schumann et al. | 365/203 |

FOREIGN PATENT DOCUMENTS 0 245 882 A2  11/1987  European Pat. Off. .
2 190 771    11/1997  United Kingdom .

OTHER PUBLICATIONS

UK Search Report, GB 9812816.8, Aug. 26, 1998.

*Primary Examiner*—David Nelms
*Assistant Examiner*—Gene N. Auduong
*Attorney, Agent, or Firm*—Myers Bigel Sibley & Sajovec

[57] ABSTRACT

A merged memory and logic (MML) integrated circuit includes a memory block having a plurality of memory banks, each of which is independently controlled by row address strobe signals, column address strobe signals and write enable signals. A logic block is connected to the memory block and generates an independent row address strobe signal, column address strobe signal and write enable signal for each of the plurality of memory banks. The memory block may also comprise a controller that independently controls each of the memory banks. The controller is connected between the logic block and the plurality of memory banks to receive the independent row address strobe signal, column address strobe signal and write enable signal for each of the plurality of memory banks from the logic block. Accordingly, high speed operation and control of memory banks in an MML integrated circuit may be provided. The MML integrated circuit also includes a test signal input/output unit that transmits external test signals from external to the MML integrated circuit to the memory block during testing of the MML integrated circuit, and that receives tests that are generated by the memory block during testing of the MML integrated circuit for transmission external to the MML integrated circuit.

28 Claims, 5 Drawing Sheets

_MERGED MEMORY AND LOGIC (MML) INTEGRATED CIRCUITS INCLUDING INDEPENDENT MEMORY BANK SIGNALS AND METHODS_

FIELD OF THE INVENTION

This invention relates to integrated circuit devices, and more particularly to integrated circuit devices having multiple banks of memory cells.

BACKGROUND OF THE INVENTION

Integrated circuit devices, such as integrated circuit memory devices and integrated circuit logic devices, are widely used in consumer and commercial applications.

Recently, merged memory and logic (MML) integrated circuits have been developed. MML integrated circuits generally include a large capacity memory and a large logic block that are merged in one integrated circuit. The large capacity memory is generally divided into a plurality of memory banks, also referred to as "memories". The logic block may also be referred to as a "logic circuit" or simply as a "logic". Thus, an MML integrated circuit can replace discrete memory and logic chips that are used in personal computers and other consumer and commercial devices.

MML integrated circuits present new challenges for control of the multiple memory banks. More specifically, FIG. 1 is a schematic block diagram of a conventional synchronous dynamic random access memory (SDRAM) having a plurality of memory banks. An SDRAM 100 having two banks, i.e., banks A and B 103 and 105 is shown in FIG. 1.

Referring to FIG. 1, a conventional SDRAM 100 includes command input pads (also referred to as pins) used in common for the banks A and B 103 and 105, i.e., one row address strobe signal $\overline{RAS}$ input pin P1, one column address strobe signal $\overline{CAS}$ input pin P2, and one write enable signal $\overline{WE}$ input pin P3. Also, a conventional SDRAM 100 includes a bank selection bit (BADDR) input pin P5. Bank A 103 or bank B 105 is selected according to the logic state of the bank selection bit BADDR. That is, the controller 101 recognizes signals $\overline{RAS}$, $\overline{CAS}$ and $\overline{WE}$ received through the command input pins P1, P2 and P3 as commands for the bank A 103 or bank B 105 according to the logic state of the bank selection bit BADDR.

In a conventional SDRAM 100, addresses ADDR0–ADDRi for addressing the bank A 103 or bank B 105, i.e., row and column addresses, are received through identical address input pins P40 through P4$i$, and multiplexed in the controller 101 in the chip. Also, in a conventional SDRAM 100, input or output data DQ0-DQk are received or generated through identical pins P10$\phi$ through P10$k$ and multiplexed in an input/output unit 107. In FIG. 1, a signal CLK received through the input pin P6 is a system clock signal, a signal CKE received through the input pin P7 is a clock enable signal, a signal $\overline{CS}$ received through the input pin P8 is a chip selection signal, and a signal DQM received through the input pin P9 is a data input/output mask signal.

The above SDRAM architecture is well known to one skilled in the art. FIG. 2 is a timing diagram of a read operation of a conventional SDRAM of FIG. 1. Unfortunately, the performance of an MML integrated circuit may degrade when the above SDRAM and a logic circuit are merged in an MML integrated circuit.

MML integrated circuits also present new challenges for the testing thereof. In particular, the MML integrated circuit generally provides a large number of internal data pads between the memory block and the logic block. For example, up to 256 or more internal data lines may be provided. Since many of these internal data lines are not brought out to external MML integrated circuit pads, it may be difficult to access all of the internal data lines in order to test the memory block.

Stated differently, in order to test a conventional memory integrated circuit, test equipment is connected to the pads of the memory integrated circuit. However, the memory block in an MML integrated circuit may be difficult to test because the memory is connected to the external pads through the logic block. Accordingly, additional pads may be needed to test the memory of the MML integrated circuit. Unfortunately, the addition of large numbers of test pads may increase the cost, size and/or complexity of an MML integrated circuit.

SUMMARY OF THE INVENTION

It is therefore an object of the present invention to provide improved memory bank controlling systems and methods for MML integrated circuits.

It is another object of the present invention to provide improved testing circuits and methods for MML integrated circuits.

These and other objects are provided, according to the present invention, by MML integrated circuits that include a memory block having a plurality of memory banks, each of which is independently controlled by row address strobe signals, column address strobe signals and write enable signals. A logic block is connected to the memory block and generates an independent row address strobe signal, column address strobe signal and write enable signal for each of the plurality of memory banks. The memory block may also comprise a controller that independently controls each of the memory banks. The controller is connected between the logic block and the plurality of memory banks to receive the independent row address strobe signal, column address strobe signal and write enable signal for each of the plurality of memory banks from the logic block. Accordingly, high speed operation and control of memory banks in an MML integrated circuit may be provided.

In a preferred embodiment of the present invention, the independent row address strobe signal, column address strobe signal and write enable signal for each of the plurality of memory blocks are each provided to the memory block on separate connection paths. Also, the independent row address strobe signal, column address strobe signal and write enable signal for each of the plurality of memory banks are each provided to the controller on separate connection paths.

The memory block may also supply output data to the logic block and the logic block may also supply input data to the memory block. The output data and the input data are supplied on separate data paths between the logic block and the memory block. Preferably, an input/output unit is connected between the memory block and the logic block. The logic block supplies input data to the memory block via the input/output unit and the memory block supplies output data to the logic block via the input/output unit. The input data and the output data are supplied on separate data paths between the logic block and the input/output unit. Preferably, the logic block supplies interleaved input data for each of the memory blocks via the input/output unit and the memory block supplies interleaved output data for each of the memory banks to the logic block via the input/output unit. Associated memory bank controlling methods are also provided.

Memory bank controlling systems and methods according to the invention may also operate in conjunction with a test signal input/output unit that transmits external test signals from external to the MML integrated circuit to the memory block during testing of the MML integrated circuit, and that receives tests that are generated by the memory block during testing of the MML integrated circuit for transmission external to the MML integrated circuit. The test signal input/output unit may also be used in MML integrated circuits independent of the memory bank controlling systems and methods described above. Associated test methods may also be provided.

The test signal input/output unit preferably comprises a test command input unit, a test address input unit and/or a test data input/output unit. The test command input unit receives external first, second and third input signals and external memory bank select signals and transmits the input signals as a row address strobe signal, a column address strobe signal and a write enable signal to a selected one of the memory banks in response to the external memory bank selection signals during a test. The test address input unit transmits external row and column addresses received to the row address path and the column address path respectively during a test. The test signal input/output unit transmits external input data to the input data path and transmits output data of the memory block from the output data path to external of the MML integrated circuit during a test.

The test command input unit preferably comprises first through fourth test pads to which the first, second and third input signals and the bank selection signal respectively are applied. A first demultiplexer receives the first input signal in response to the bank selection signal and transmits the first signal as a row address strobe signal for the selected bank to the memory block. A second demultiplexer receives the second input signal in response to the bank selection signal, and transmits the second input signal as the column address strobe signal for the selected bank to the memory block. A third demultiplexer receives the third input signal in response to the bank selection signal and transmits the third input signal as a write enable signal of the selected bank to the memory block.

The test address input unit preferably comprises a fifth test pad, connected to the row address pad and the column address pad, to which the row address and the column address are applied. The test data input/output unit preferably comprises a bidirectional buffer including an output buffer that buffers output data transmitted to the output data path in response to a control signal, and an input buffer that buffers external input data to generate the buffer data to the input data path. A sixth test pad is commonly connected to an output terminal of the output buffer and an input terminal of the input buffer. The input data and output data are received and generated respectively through the sixth test pad.

Aspects of the present invention may also be applied to integrated circuit memory devices that includes a plurality of memory banks including memory cells. A controller independently controls each of the memory banks in response to row address strobe signals, column address strobe signals and write enable signals that are received through separate external pads for each of the banks. Row addresses and column addresses for the plurality of memory banks may be received through separate external pads. Output data generated from the plurality of banks and input data written into the plurality of banks may be received and generated respectively through separate pads. Associated methods may also be provided.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
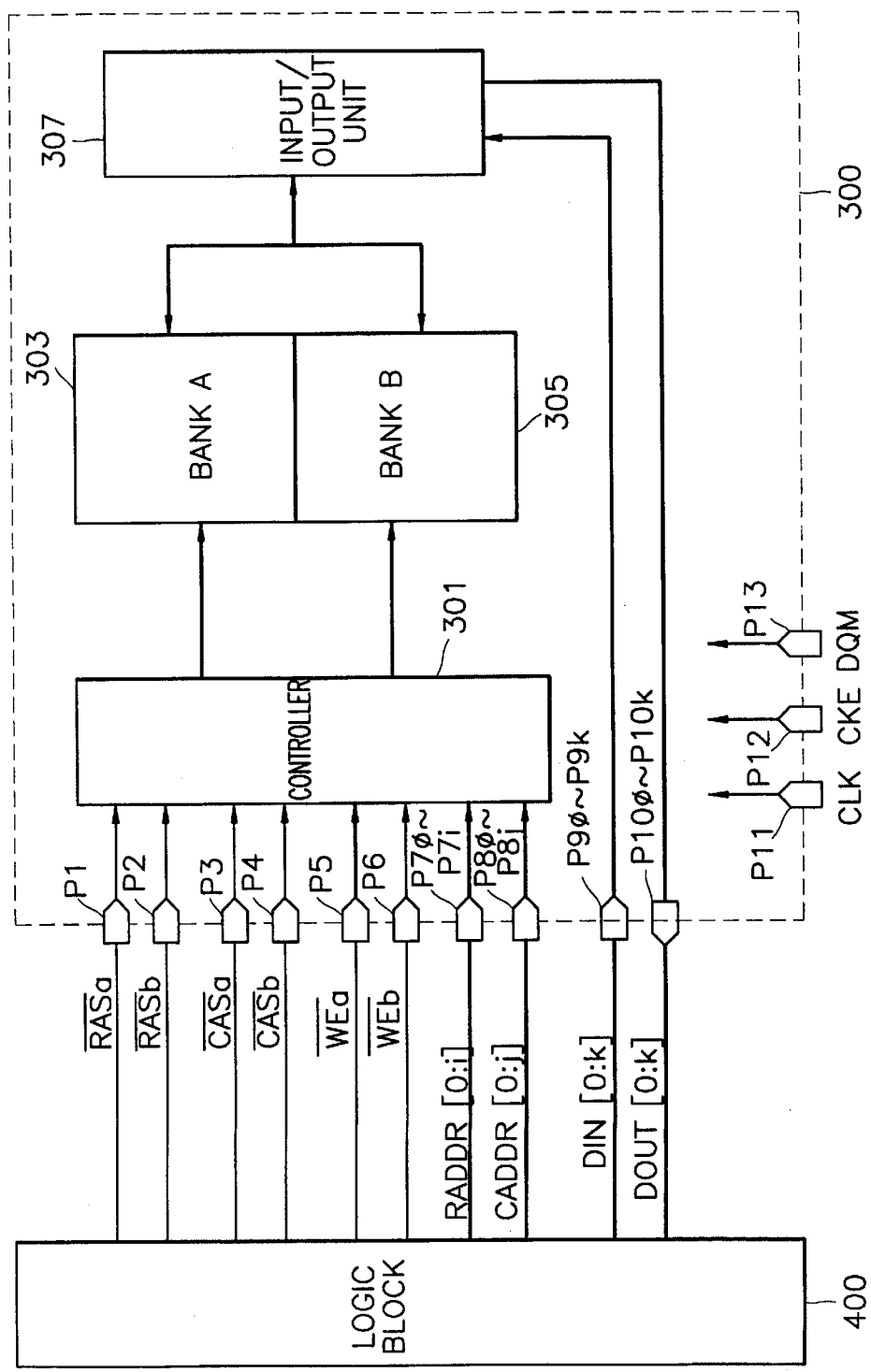
FIG. 3 is a block diagram of MML integrated circuits according to the present invention.

Referring to FIG. 3, an MML integrated circuit 200 according to the present invention includes a memory block 300 having an improved SDRAM and a logic block 400.

The memory block 300 includes a plurality of banks having memory cells, i.e., banks A and B 303 and 305, a controller 301, an input/output unit 307, and various peripheral circuits.

In the memory block 300, one row address strobe signal $\overline{RAS}$ path, one column address strobe signal $\overline{CAS}$ path and one write enable signal $\overline{WE}$ path, which are conventionally used in common, are separately provided for each of the banks A and B 303 and 305, and connected to the logic block 400.

Accordingly, each of the banks A and B 303 and 305 respectively is controlled independently by command signals generated from the logic block 400, i.e., row address strobe signals $\overline{RAS}a$ and $\overline{RAS}b$, column address strobe signals $\overline{CAS}a$ and $\overline{CAS}b$, and write enable signals $\overline{WE}a$ and $\overline{WE}b$, respectively. That is, the bank A 303 is controlled by the row address strobe signal $\overline{RAS}a$, the column address strobe signal $\overline{CAS}a$ and the write enable signal $\overline{WE}a$, and the bank B 305 is controlled y the row address strobe signal $\overline{RAS}b$, the column address strobe signal $\overline{CAS}b$ and the write enable signal $\overline{WE}b$.

Also, row and column address paths which are conventionally merged into one pad are separately provided as a row address path and a column address path in the memory block 300. Accordingly, the row address path RADDR[0:i] and the column address CADDR[0:j] are generated by the logic block 400 and independently applied to the memory block 300 through the additional path. The input/output data path merged into one pad in the conventional SDRAM is also separated into an additional path in the memory block 300. Accordingly, the input data DIN[0:k] is generated from the logic block 400 and received by the memory block 300 through the input data path, and the output data DOUT[0:k] is read out from the memory block 300 and transmitted to the logic block 100 through the additional output data path.

In detail, the controller 301 of the memory block 300 receives the row address strobe signals $\overline{RAS}a$ and $\overline{RAS}b$, the column address strobe signals $\overline{CAS}a$ and $\overline{CAS}b$, the write enable signals $\overline{WE}a$ and $\overline{WE}b$, the row address RADDR [0:i], and the column address CADDR[0:j], to independently control the banks A and B 303 and 305. The input data DIN[0:k] and the output data DOUT[0:k] are time-multiplexed in an input/output unit 307 of the memory block 300. That is, during a write operation, the input data DIN [0:k] is written in the bank A 303 or bank B 305 through the input/output unit 307. During a read operation, the output data DOUT[0:k] is read out from the bank A or bank B 303 or 305 and transmitted to the logic block 400 through the input/output unit 307. In FIG. 3, the signal CLK is a system clock, the signal CKE is a clock enable signal and the signal DQM is a data input/output mask signal.

The logic block 400 may have various configurations embodied by various logic circuits, and has the functions of controlling, operating and interfacing. Also, the logic block 400 generates the row address strobe signals $\overline{RAS}a$ and $\overline{RAS}b$, the column address strobe signals $\overline{CAS}a$ and $\overline{CAS}b$, the write enable signals $\overline{WE}a$ and $\overline{WE}b$, the row address RADDR[0:i] and the column address CADDR[0:j], and receives and transmits the input data DIN[0:k] and output data DOUT[0:k] from and to the memory block 300.

The memory block 300 also may be designed and manufactured as one integrated circuit chip without including the logic block 400. The command signals, i.e., the row address strobe signals $\overline{RAS}a$ and $\overline{RAS}b$, the column address strobe signals $\overline{CAS}a$ and $\overline{CAS}b$, and the write enable signals $\overline{WE}a$ and $\overline{WE}b$, are supplied externally to the chip. Also, the row address RADDR[0:i] and column address CADDR[0:k], the system clock CLK, the clock enable signal CKE and the data input/output mask signal DQM, are supplied externally to the chip. The output data DOUT[0:k] is generated externally from the chip. Accordingly, when the memory block 300 is designed as one chip, the memory block 300 includes input pads P1 to P6, P70 to P7$i$, P80 to P8$j$, P90 to P9$k$, and P11 to P13 corresponding to the input signals and output pads P100 to P10$k$ corresponding to the output signal DOUT0~DOUTk.

Figure 4:
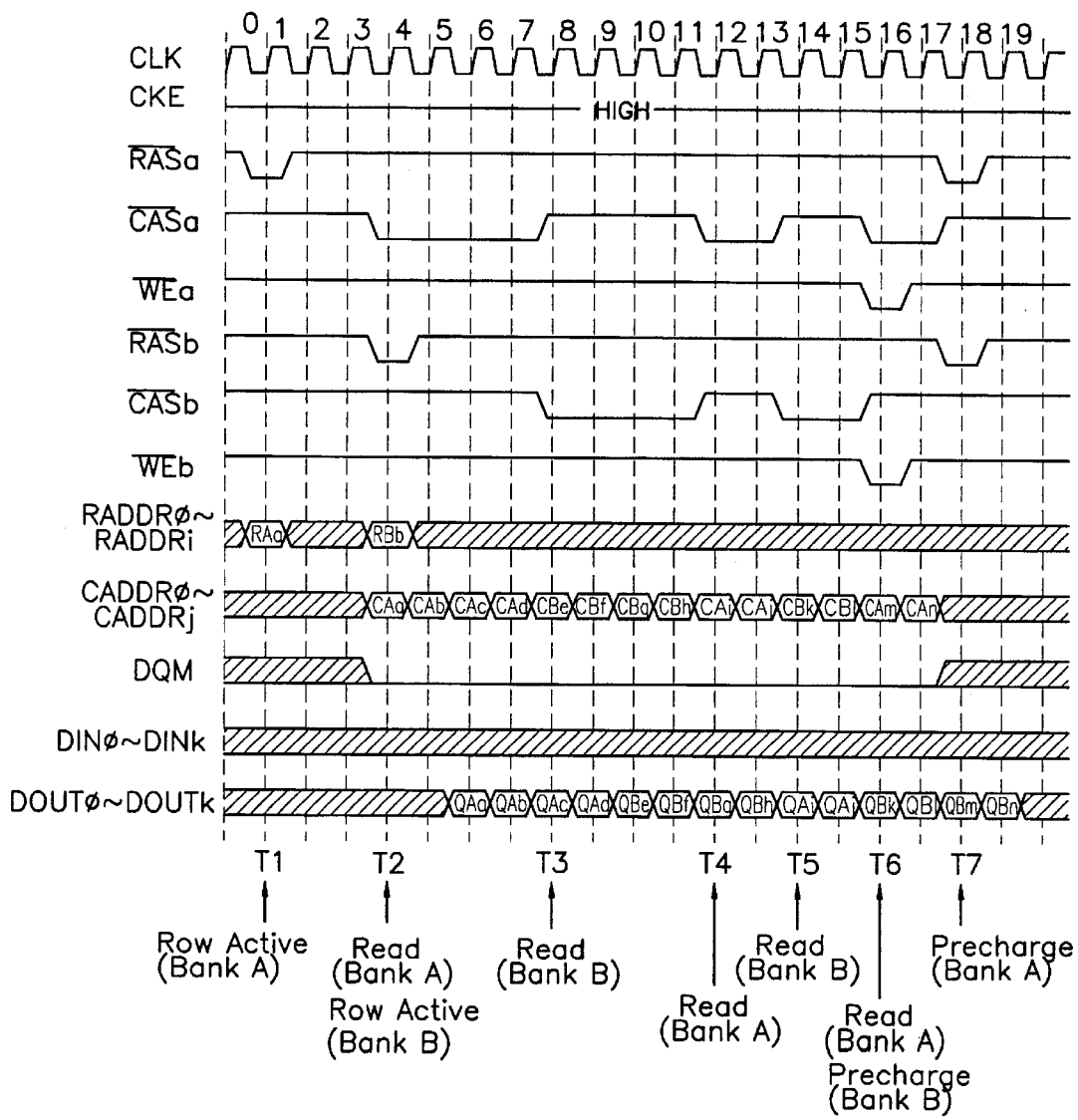
FIG. 4 is a timing diagram of a read operation of a memory block of MML integrated circuits of FIG. 3.

FIG. 4 is a timing diagram of a read operation of the memory block of FIG. 3. The read operation of the memory block of FIG. 3 will be described with reference to FIG. 4.

When the clock enable signal CKE becomes active to logic high, a system clock signal CLK is received. When the write enable signal $\overline{WE}a$ for the bank A 303 becomes active to logic high, a row address strobe signal $\overline{RAS}a$ for the bank A 303 becomes logic low at cycle 0 of the system clock CLK. When a row address RADDR[0:i] is received, the row address is regarded as a row address RAa of the bank A 303. Accordingly, a row of the bank A 303 corresponding to the row address RAa becomes active (T1).

At a predetermined time, when the column address strobe signal $\overline{CAS}a$ for the bank A 303 becomes logic low at cycle 3 of the system clock CLK and the column address CARRR [0:j] is sequentially received, they are regarded as column addresses CAa, CAb, CAc and CAd of the A bank 303.

Accordingly, columns of the bank A 303 corresponding to the column addresses CAa, CAb, CAc and CAd are sequentially made active, to thereby start the read operation of the bank A (at T2). Output data QAa, QAb, QAc and QAd read from memory cells of the bank A are sequentially generated through the input/output unit 307, to be transmitted to the logic block 400. As described above, at a predetermined time after the read operation of the bank A is performed, the row address strobe signal $\overline{RAS}a$ becomes logic low and the write enable signal $\overline{WE}a$ becomes inactive to logic low at cycle 17 of the system clock CLK. The bank A then starts a precharge operation.

Also, when the write enable signal $\overline{WE}b$ for the bank B 305 becomes active to logic high, when the row address strobe signal $\overline{RAS}b$ for the bank B 305 becomes logic low at cycle 3 of the system clock CLK, and the row address RADDR[0:i] is received, the row address RADDR[0:i] is regarded as a row address RAb of the bank B 305. Accordingly, the row of the bank B 305 corresponding to the row address RAb becomes active.

At a predetermined time after T2, when a column address strobe signal $\overline{CAS}b$ for the bank B 305 becomes logic low at cycle 7 of the system clock CLK, and the column address CADDR[0:j] is sequentially received, the column address CADDR[0:j] is regarded as column addresses CBe, CBf, CBg and CBh of the bank B 305. Accordingly, columns of the bank B 305 corresponding to the column addresses CBe, CBE, CBG and CBh are sequentially made active, to thereby start a read operation of the bank B (at T3). Output data QBe, QBf, QBg and QBh read from memory cells of the B bank are sequentially generated through the input/output unit 307, to be transmitted to the logic block 400. A predetermined time after the abovedescribed read operation of the bank B is performed, as in the operation of the bank A, when the row address strobe signal $\overline{RAS}b$ becomes logic low and the write enable signal $\overline{WE}b$ becomes inactive to logic low at cycle 15 of the system clock CLK, a precharge operation of the bank B starts.

Accordingly, in the memory block of FIG. 3, each bank is independently controlled by command signals, i.e., row address strobe signals $\overline{RAS}a$ and $\overline{RAS}b$, column address signals $\overline{CAS}a$ and $\overline{CAS}b$, and write enable signals $\overline{WE}a$ and $\overline{WE}b$. That is, the active and read operations and the precharge operation of the bank A 303 are controlled by the row address strobe signal $\overline{RAS}a$, the column address strobe signal $\overline{CAS}a$ and the write enable signal $\overline{WE}a$, and the active and read operations and the precharge operation of the bank B 305 are controlled by the row address strobe signal $\overline{RAS}b$, the column address strobe signal $\overline{CAS}b$ and the write enable signal $\overline{WE}b$.

Figure 1:
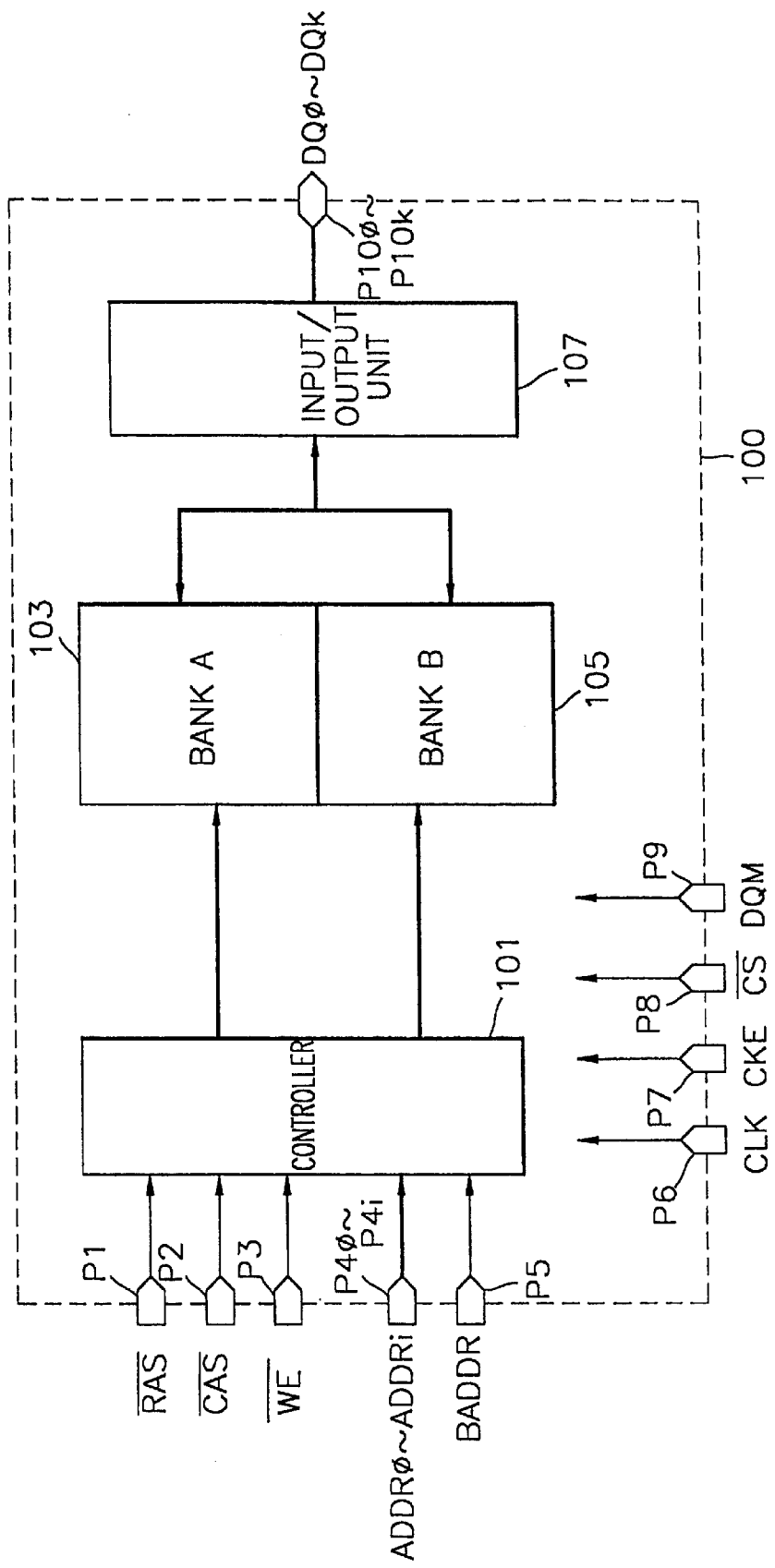
FIG. 1 is a schematic block diagram of a conventional SDRAM.
Figure 2:
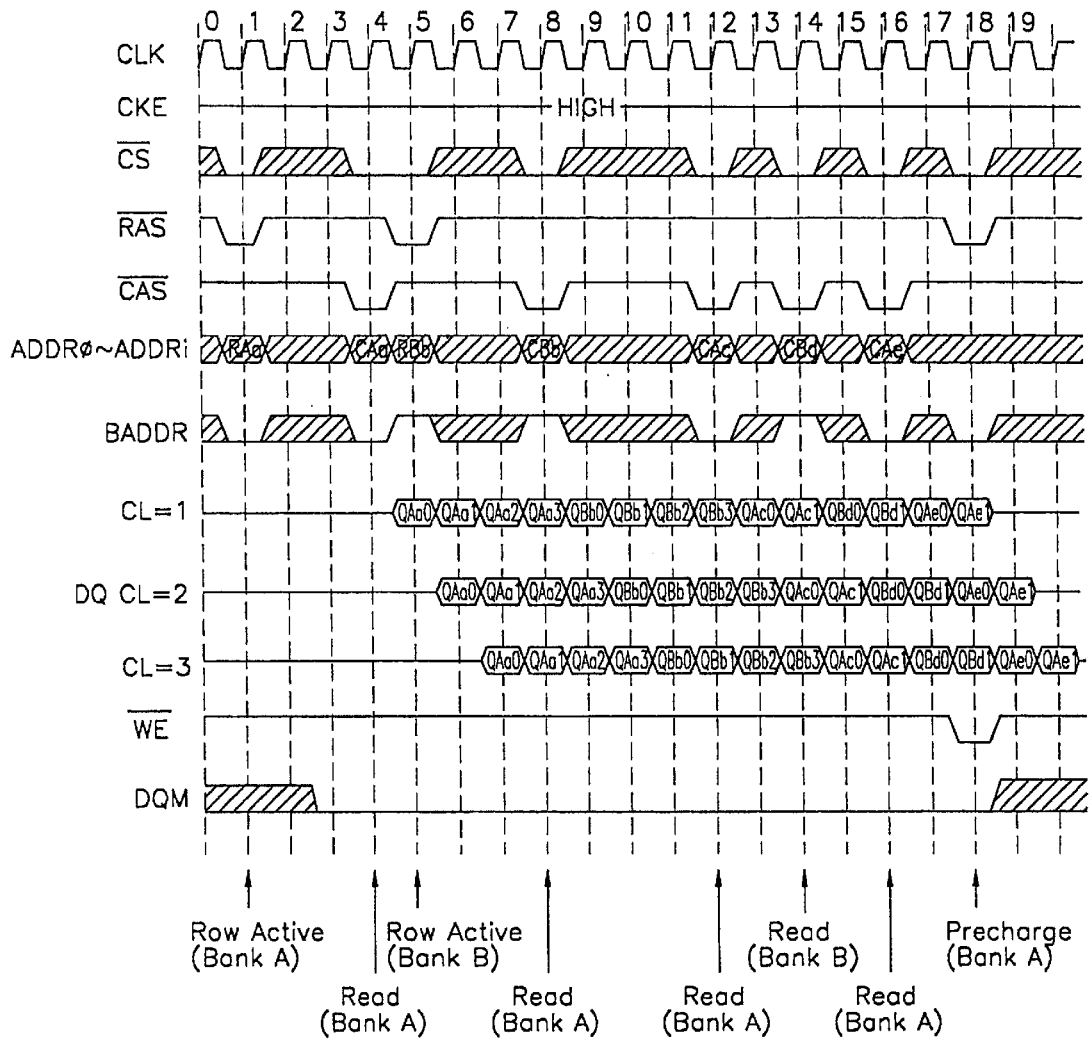
FIG. 2 is a timing diagram of a read operation of the SDRAM of FIG. 1.

Compared to a conventional SDRAM of FIG. 1, performance may be greatly enhanced as shown in Table 1. Thus, the overall performance of the MML integrated circuit 200 may be greatly enhanced.

TABLE 1

| COMMAND SEQUENCE | CONVENTIONAL SDRAM | MEMORY BLOCK ACCORDING TO THE PRESENT INVENTION | COMMAND SEQUENCE | CONVENTIONAL SDRAM | MEMORY BLOCK ACCORDING TO THE PRESENT INVENTION |
|---|---|---|---|---|---|
| A → P | 1 | 0 | P → R | 1 | 0 |
| A → R | 1 | 0 | P → W | 1 | 0 |
| A → W | 1 | 0 | R → A | 1 | 0 |
| F → P | 1 | 0 | R → F | 1 | 0 |
| F → R | 1 | 0 | R → P | 1 | 0 |
| F → W | 1 | 0 | W → A | 1 | 0 |
| P → A | 1 | 0 | W → F | 1 | 0 |
| P → F | 1 | 0 | W → P | 1 | 0 |
| P → P | 1 | 0 | | | |

In Table 1, 'A' indicates a command, 'F' indicates a refresh command, 'P' indicates a precharge command, 'R' indicates a read command, and 'W' indicates a write command. Also, the 0's and 1's indicate the number of cycles of the system clock CLK, for example, when A→P=1, one clock cycle is used to apply an active command to one of the banks A and B and apply a precharge command to the other bank.

As shown in Table 1, while one clock cycle in a conventional SDRAM is used to apply a predetermined command to one bank and to apply a predetermined command to the other bank, no clock cycles need be used for the memory block according to the present invention. That is, commands can be simultaneously applied to each bank, so that performance can be greatly enhanced.

Systems and methods for testing the memory block 300 of he MML 200 of FIG. 3 will now be described.

To directly test the memory block 300 of the MML 200, test pads directly connected to an external tester should be connected to paths of all signals. However, since the paths of all signals are separated, an excessive number of pads may be needed to connect the paths to test pads. Accordingly, the size of the chip may increase excessively. Moreover, the number of chips capable of being simultaneously tested may be reduced in a tester, to thereby increase the overall test time.

Figure 5:
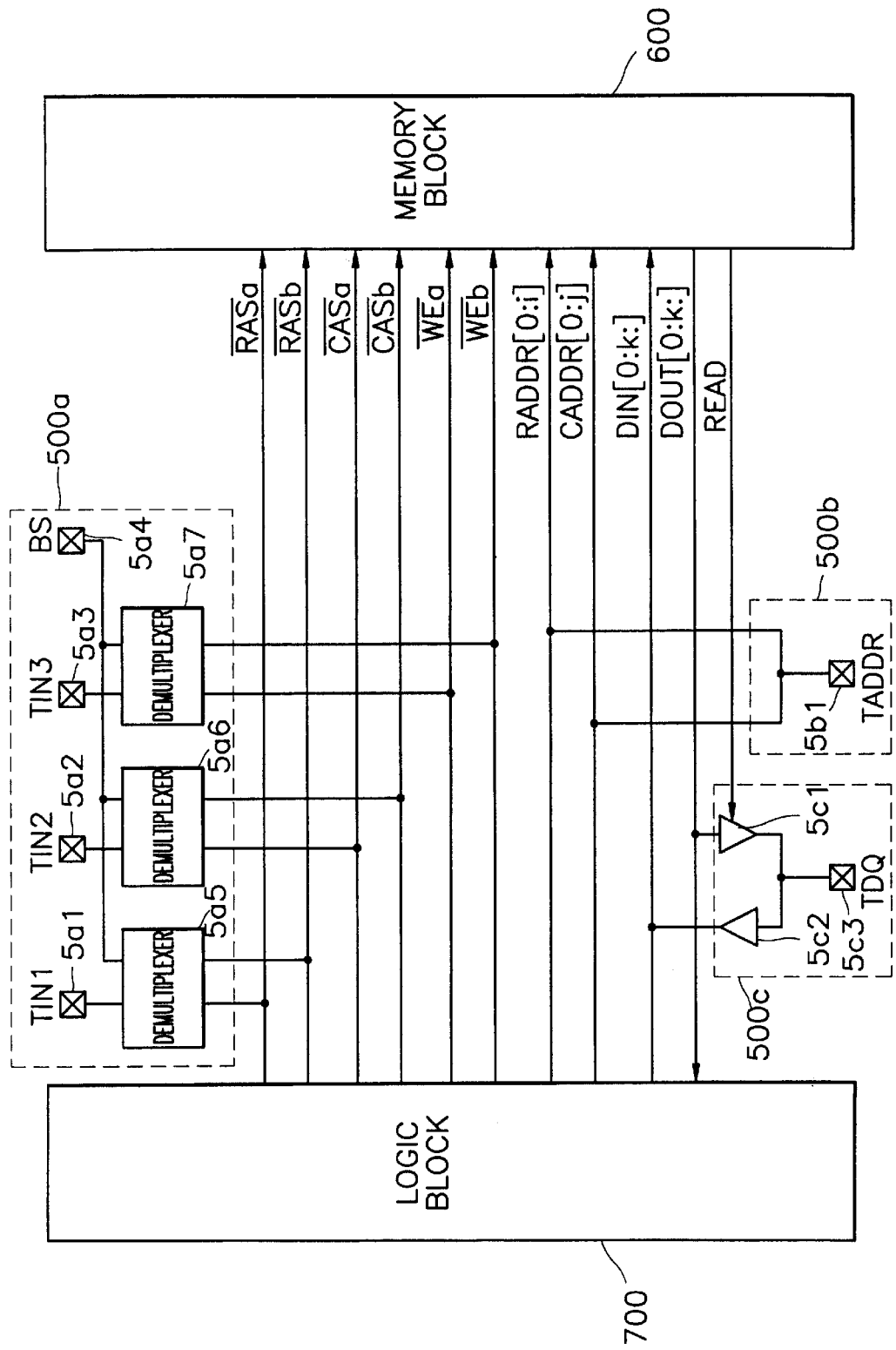
FIG. 5 is a block diagram of MML integrated circuits including a test signal input/output unit according to the present invention.

FIG. 5 is a block diagram of an MML including a test signal input/output unit according to the present invention.

Referring to FIG. 5, an MML 800 includes a memory block 600, a logic block 700 corresponding to the logic block 400 of FIG. 3, and memory block 300 corresponding to the memory block 200 of FIG. 3. Test signal input/output units 500a, 500b and 500c are also included.

The test signal input/output units 500a, 500b and 500c allow reduction in the number of test pads during a test by transmitting external signals to the memory block 600 and transmitting signals generated by the memory block 600 externally.

The test signal input/output unit includes at least one of a test command input unit 500a, a test address input unit 500b and a test data input/output unit 500c.

During a test, the test command input unit 500a receives external first, second and third input signals TIN1, TIN2 and TIN3, in response to an external bank selection signal BS, to transmit the input signals as the row address strobe signal $\overline{RASa}$ or $\overline{RASb}$, the column address strobe signal $\overline{CASa}$ or $\overline{CASb}$, and the write enable signal $\overline{WEa}$ or $\overline{WEb}$ of the selected bank to the memory block 600, respectively. In detail, the test command input unit 500a includes first through fourth test pads 5a1, 5a2, 5a3 and 5a4 and first through third demultiplexers 5a5, 5a6 and 5a7. The external first to third input signals TIN1, TIN2 and TIN3 and the bank selection signal BS are applied to the first through fourth test pads 5a1, 5a2, 5a3 and 5a4, respectively.

The first demultiplexer 5a5 receives the first input signal TIN1, in response to the bank selection signal BS, to transmit the first input signal TIN1 as a row address strobe signal $\overline{RASa}$ or $\overline{RASb}$ of the selected bank to the memory block 600. The second demultiplexer 5a6 receives the second input signal TIN2, in response to the bank selection signal BS, to transmit the second input signal TIN2 as a column address strobe signal $\overline{CASa}$ or $\overline{CASb}$ of the selected bank to the memory block 600. The third demultiplexer 5a7 receives the third input signal TIN3, in response to the bank selection signal, to transmit the third input signal TIN3 as a write enable signal $\overline{WEa}$ or $\overline{WEb}$ of the selected bank to the memory bank 600.

The test address input unit 500b includes a fifth test pad 5b1 to which an external address TADDR is applied during a test, commonly connected to a row address RADDR[0:i] path and a column address CADDR[0:j] path. The test address input unit 500b transmits the address applied to the fifth test pad 5b1 to the row address RADDR[0:i] path or the column address CADDR[0:j] path, respectively.

During a test, the test data input/output unit 500c transmits external data to the input data DIN[0:k] path and the data of the memory block 600 transmitted to the output path DOUT[0:k] externally, commonly connected to the input data DIN[0:k] path and the output data DOUT[0:k] path. In detail, the test data input/output unit 500c includes a bidirectional buffer including an output buffer 5c1 and an input buffer 5c2 and a sixth test pad 5c3 commonly connected to an output terminal of the output buffer 5c1 and an input terminal of the input buffer 5c2. The output buffer 5c1 buffers data transmitted to the output data DOUT[0:k] path, in response to a control signal READ generated by the memory block 600 and generates the buffered data through the sixth test pad 5c3 externally. The input buffer 5c2 buffers data received through the sixth test pad 5c3 and generates the buffered data to the input data DIN[0:k] path.

Accordingly, in an MML including the test signal input/output units 500a, 500b and 500c, the two row address strobe signal paths, the two column address strobe signal paths, and the two write enable signal paths are merged with the first, second and third test pads 5a1, 5a2 and 5a3 by the first, second and third demultiplexers 5a5, 5a6, and 5a7, respectively, to thereby allow reduction of the number of test pads. Also, the row address path and the column address path are merged with the fifth test pad 5b1 of the test address input unit 500b, to thereby allow reduction of the number of test pads for receiving addresses by half.

As a result, MML integrated circuits according to the present invention include memory blocks that can have enhanced performance compared to a conventional SDRAM, to thereby allow enhanced performance of the MML. Also, MML integrated circuits according to the present invention include a test signal input/output unit in which test pads are effectively merged, to thereby allow reduction of the number of test pads and the test time.

As described above, it should be understood that the invention is not limited to the illustrated embodiment and that many changes and modifications can be made within the scope of the invention by a person skilled in the art.

What is claimed is:

1. A merged memory and logic (MML) integrated circuit comprising:
   a memory block in the MML integrated circuit, including a plurality of memory banks, each of which is independently controlled by row address strobe signals, column address strobe signals and write enable signals, the memory block receiving and generating input data and output data, respectively on separate data paths; and
   a logic block in the MML integrated circuit that is connected to the memory block in the MML integrated circuit and that generates an independent row address strobe signal, an independent column address strobe signal and an independent write enable signal for each of the plurality of memory banks, the logic block exchanging the input data and the output data with the memory block on the separate data paths.

2. An MML integrated circuit according to claim 1 wherein the memory block is a synchronous DRAM memory block including a plurality of synchronous DRAM memory banks.

3. An MML integrated circuit according to claim 1 wherein the memory block further comprises a controller that independently controls each of the memory banks, the controller being connected between the logic block and the plurality of memory banks to receive the independent row address strobe signal, column address strobe signal and write enable signal for each of the plurality of memory banks from the logic block.

4. An MML integrated circuit according to claim 3 wherein the independent row address strobe signal, column address strobe signal and write enable signal for each of the plurality of memory banks are each provided to the controller on separate connection paths.

5. An MML integrated circuit according to claim 3 further comprising an input/output unit that is connected between the memory block and the logic block, the logic block supplying the input data to the memory block via the input/output unit and the memory supplying the output data to the logic block via the input/output unit.

6. An MML integrated circuit according to claim 5 wherein the logic block supplies interleaved input data for each of the memory banks via the input/output unit and the memory block supplies interleaved output data for each of the memory banks to the logic block via the input/output unit.

7. An MML integrated circuit according to claim 1 wherein the independent row address strobe signal, column address strobe signal and write enable signal for each of the plurality of memory banks are each provided to the memory block on separate connection paths.

8. An MML integrated circuit according to claim 7 wherein the logic block generates an independent row address strobe signal, column address strobe signal and write enable signal for each of the plurality of memory banks during normal operation of the MML integrated circuit, the MML integrated circuit further comprising:
   a test signal input/output unit that transmits external test signals from external to the MML integrated circuit to the memory block during testing of the MML integrated circuit and that receives test signals that are generated by the memory block during testing of the MML integrated circuit for transmission external to the MML integrated circuit.

9. An MML integrated circuit according to claim 8, wherein the test signal input/output unit comprises a test command input unit that receives external first, second and third input signals and external memory bank select signals and transmits the first, second and third input signals as a row address strobe signal, a column address strobe signal and a write enable signal to a selected one of the memory banks in response to the external memory bank selection signals during a test, wherein the test command input unit comprises:
   first through fourth test pads to which the first, second and third input signals and the bank selection signals respectively are applied;
   a first demultiplexer that receives the first input signal in response to the bank selection signal and transmits the first input signal as a row address strobe signal for the selected bank to the memory block;
   a second demultiplexer that receives the second input signal in response to the bank selection signal and transmits the second input signal as the column address strobe signal for the selected bank to the memory block; and
   a third demultiplexer that receives the third input signal in response to the bank selection signal and transmits the third input signal as a write enable signal of the selected bank to the memory block.

10. An MML integrated circuit according to claim 9, wherein the test address input unit comprises a fifth test pad commonly connected to the row address path and the column address path, to which the row address and the column address are applied.

11. An MML integrated circuit according to claim 10, wherein the test data input/output unit comprises:
   a bidirectional buffer including an output buffer that buffers output data transmitted to the output data path in response to a control signal, and an input buffer that buffers external input data to generate the buffered data to the input data path; and
   a sixth test pad commonly connected to an output terminal of the output buffer and an input terminal of the input buffer, wherein the input data and the output data are received an generated respectively, through the sixth test pad.

12. A merged memory and logic (MML) integrated circuit comprising:
   a memory block in the MML integrated circuit including a plurality of memory bank, each of which is independently controlled by independent row address strobe signals, independent column address strobe signals and independent write enable signals on separate connection paths, the memory block receiving the memory block row address and column address on separate connection paths, and receiving and generating input and output data respectively, on separate connection paths;

a logic block in the MML integrated circuit that is connected to the memory block in the MML integrated circuit to generate the independent row address strobe signals, the independent column address strobe signals and the independent write enable signals for each memory bank on the separate connection paths, that generates the rove address and the column address for the memory block on the separate connection paths, and that exchanges the input data and the output data with the memory block on the separate connection paths, during normal operation; and a test signal input/output unit in the MML integrated circuit that transmits test signals from external to the memory block during a test and that receives test signals that are generated by the memory block during a test, for transmission external to the MML integrated circuit.

13. An MML integrated circuit according to claim 12 wherein the test signal input/output unit comprises:

a test command input unit that receives external first, second and third input signals and external memory bank select signals and transmits the input signals as a row address strobe signal, a column address strobe signal and a write enable signal to a selected one of the memory banks in response to the external memory bank selection signals during a test.

14. An MML integrated circuit according to claim 13, wherein the test command input unit comprises:

first through fourth test pads to which the first, second and third input signals and the bank selection signals respectively are applied;

a first demultiplexer that receives the first input signal in response to the bank selection signal and transmits the first input signal as a row address strobe signal for the selected bank to the memory block;

a second demultiplexer that receives the second input signal in response to the bank selection signal and transmits the second input signal as the column address strobe signal for the selected bank to the memory block; and a third demultiplexer that receives the third input signal in response to the bank selection signal and transmits the third input signal as a write enable signal of the selected bank to the memory block.

15. An MML integrated circuit according to claim 14, wherein the test address input unit comprises a fifth test pad commonly connected to the row address path and the column address path, to which the row address and the column address are applied.

16. An MML integrated circuit according to claim 15, wherein the test data input/output unit comprises:

a bidirectional buffer including an output buffer that buffers output data transmitted to the output data path in response to a control signal, and an input buffer that buffers external input data to generate the buffered data to the input data path; and a sixth test pad commonly connected to an output terminal of the output buffer and an input terminal of the input buffer, wherein the input data and the output data are received an generated respectively, through the sixth test pad.

17. An MML integrated circuit according to claim 12 herein the test signal input/output unit comprises:

a test address input unit that transmits external row and column addresses received to the row address path and the column address path, respectively, during a test.

18. An MML integrated circuit according to claim 12 wherein the test signal input/output unit comprises:

a test data input/output unit that transmits external input data to the input data path and that transmits output data of the memory block from the output data path to external of the MML integrated circuit, during a test.

19. An integrated circuit memory device comprising:

a plurality of memory banks in the integrated circuit memory device, each memory bank including memory cells, the plurality of memory banks receiving and generating input data and output data, respectively through separate external pads; and a controller in the integrated circuit memory device that independently controls each of the memory banks, in response to row address strobe signals, column address strobe signals, and write enable signals that are received through the separate external pads on the integrated circuit memory device for each of the memory banks.

20. An integrated circuit memory device according to claim 19 wherein row addresses and column address for the plurality of memory banks are received through the separate external pads.

21. A method of operating a merged memory and logic (MML) integrated circuit comprising a memory block in the MML integrated circuit including a plurality of memory banks, each of which is controlled by row address strobe signals, column address strobe signals and write enable signals, and a logic block in the MML integrated circuit that is connected to the memory block in the MML integrated circuit; the method comprising the step of:

generating an independent row address strobe signal, an independent column address strobe signal and an independent write enable signal by the logic block, for each of the plurality of memory banks; and supplying input data and output data on separate data paths between the logic block and the memory block.

22. A method according to claim 21 wherein the generating step comprises the step of generating the independent row address strobe signal, column address strobe signal and write enable signal for each of the plurality of memory banks on separate connection paths to the memory banks.

23. A method according to claim 21 wherein the supplying step comprises the step of supplying interleaved input data for each of the memory banks and supplying interleaved output data for each of the memory banks to the logic block on the separate data paths.

24. A method according to claim 21 further comprising the steps of:

transmitting external test signals from external to the MML integrated circuit to the memory block during testing of the MML integrated circuit; and receiving test signals that are generated by the memory block during testing of the MML integrated circuit for transmission external to the MML integrated circuit.

25. A method according to claim 24 wherein the transmitting step comprises the steps of:

receiving external first, second and third input signals and external memory bank select signals; and transmitting the input signals as a row address strobe signal, a column address strobe signal and a write enable signal to a selected one of the memory banks in response to the external memory bank selection signals during a test.

26. A method according to claim 24 wherein the transmitting step comprises the step of:

transmitting external row and column addresses received to a row address path and a column address path, respectively, during a test.

27. A method according to claim 24 wherein the transmitting and receiving steps comprise the steps of:

transmitting external input data to the input data path; and transmitting the output data of the memory block from the output data path to external of the MML integrated circuit, during a test.

28. A method according to claim 24, wherein the transmitting step comprises the steps of:

receiving a first input signal at a first test pad of the MML integrated circuit in response to the bank selection signal at a fourth test pad of the MML integrated circuit and transmitting the first input signal as a row address strobe signal for the selected bank to the memory block;

receiving a second input signal at a second test pad of the MML integrated circuit in response to the bank selection signal at the fourth test pad of the MML integrated circuit and transmitting the second input signal as the column address strobe signal for the selected bank to the memory block; and receiving a third input signal at a third test pad of the MML integrated circuit in response to the bank selection signal at the fourth test pad of the MML integrated circuit and transmitting the third input signal as a write enable signal of the selected bank to the memory block.

* * * * *

UNITED STATES PATENT AND TRADEMARK OFFICE
CERTIFICATE OF CORRECTION

PATENT NO. : 6,067,255

DATED : May 23, 2000

INVENTOR(S) : Jung et al.

It is certified that error appears in the above-identified patent and that said Letters Patent is hereby corrected as shown below:

Column 11, line 7, please delete "rove" and substitute – row – therefor.

Signed and Sealed this

Twenty-seventh Day of March, 2001

Attest:

NICHOLAS P. GODICI

*Attesting Officer*   *Acting Director of the United States Patent and Trademark Office*